(12) United States Patent
Wang et al.

(10) Patent No.: US 9,356,213 B2
(45) Date of Patent: May 31, 2016

(54) MANUFACTURING METHOD OF A LIGHT-EMITTING DEVICE HAVING A PATTERNED SUBSTRATE

(71) Applicant: Wuxi China Resources Huajing Microelectronics Co., Ltd., Wuxi, Jiangsu (CN)

(72) Inventors: Lei Wang, Jiangsu (CN); Guoqi Li, Jiangsu (CN); Zhiyan Yu, Jiangsu (CN); Rongsheng Pu, Jiangsu (CN)

(73) Assignee: WUXI CHINA RESOURCES HUAJING MICROELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 14/862,978

(22) Filed: Sep. 23, 2015

(65) Prior Publication Data

US 2016/0013386 A1     Jan. 14, 2016

Related U.S. Application Data

(62) Division of application No. 14/376,080, filed as application No. PCT/CN2012/085722 on Dec. 3, 2012, now Pat. No. 9,172,002.

(30) Foreign Application Priority Data

Apr. 27, 2012   (CN) .......................... 2012 1 0127827

(51) Int. Cl.
*H01L 33/38*     (2010.01)
*H01L 33/62*     (2010.01)
(Continued)

(52) U.S. Cl.
CPC ............ *H01L 33/62* (2013.01); *H01L 33/0075* (2013.01); *H01L 33/08* (2013.01); *H01L 33/22* (2013.01); *H01L 33/38* (2013.01);
(Continued)

(58) Field of Classification Search
None
See application file for complete search history.

(56) References Cited

U.S. PATENT DOCUMENTS

| 2007/0018182 | A1 | 1/2007 | Beeson et al. |
| 2010/0219505 | A1* | 9/2010 | D'Evelyn ................ C30B 7/105 257/615 |
| 2011/0294242 | A1* | 12/2011 | Lu .......................... H01L 33/20 438/27 |

FOREIGN PATENT DOCUMENTS

| CN | 1601774 A | 3/2005 |
| CN | 101859861 A | 10/2010 |

OTHER PUBLICATIONS

International Search Report for corresponding PCT application No. PCT/CN2012/085722.

*Primary Examiner* — Pamela E Perkins
(74) *Attorney, Agent, or Firm* — Wood, Phillips, Katz, Clark & Mortimer

(57) ABSTRACT

A manufacturing method of a light-emitting diode device. The light-emitting diode device comprises: a substrate (1); an epitaxial layer at one side of the substrate (1) and comprising an N-type layer (2), a P-type layer (4), and an active layer (3) between the N-type layer (2) and the P-type layer (4); an N-type electrode (5); a P-type electrode (7); an adhesive layer (8); and a patterned substrate (9). The light-emitting diode device further comprises an insulating layer (6) between the N-type electrode (5) and the P-type electrode (7), the insulating layer (6) electrically insulating the N-type electrode (5) and the P-type electrode (7). In the manufacturing method thereof, light-emitting efficiency and luminous efficiency of the light-emitting diode device can be improved, wiring is easier as compared with conventional chips, and the manufacturing process can be optimized.

8 Claims, 3 Drawing Sheets

(51) Int. Cl.
*H01L 33/10* (2010.01)
*H01L 33/08* (2010.01)
*H01L 33/00* (2010.01)
*H01L 33/22* (2010.01)

(52) U.S. Cl.
CPC ...... *H01L 33/385* (2013.01); *H01L 2933/0016* (2013.01); *H01L 2933/0066* (2013.01)

MANUFACTURING METHOD OF A LIGHT-EMITTING DEVICE HAVING A PATTERNED SUBSTRATE

FIELD OF THE INVENTION

The present disclosure relates to a Light-Emitting Diode (LED) device and a manufacturing method thereof, and in particularly to a high power Light-Emitting Diode device with an improved light efficiency and a manufacturing method thereof.

BACKGROUND OF THE INVENTION

A Light-Emitting Diode device is a well-known solid state lighting element, which emits light once if a voltage is applied thereto. The Light-Emitting Diode device generally includes a diode region (which is usually called as an epitaxial layer) which includes an N-type layer, a P-type layer and a P-N junction, where an anode contact is in ohmic contact with the P-type layer and a cathode contact is in ohmic contact with the N-type layer. Typically, the diode region, i.e. the epitaxial layer, may be formed epitaxially on a substrate and the epitaxial layer is generally made of gallium nitride-based material. Moreover, a sapphire is typically chosen as a substrate for growth of the epitaxial layer due to the restriction by a crystal structure and growth conditions of gallium nitride.

However, there exist the following problems in the technical solutions of the prior art. Due to the poor thermal conductivity and electrical conductivity of the sapphire, the Light-Emitting Diode device made of the gallium nitride-based material has a poor heat dissipation property, a short lifespan and a complicated manufacturing process, thus limiting the application of the sapphire in high power (i.e., high brightness) Light-Emitting Diodes. Furthermore, for a gallium nitride-based Light-Emitting Diode (GaN-based LED) device having a structure with a horizontal formal electrode, a P-type electrode will block light, thus the P-type electrode is required to have a good ITO extension layer, resulting in a low light efficiency and a complicated manufacturing process of the GaN-based LED device.

In order to solve the above problems, one of the existing improved solutions adopts silicon carbide (SiC) as a substrate and utilizes a structure with electrodes one above the other. However, although the improved solution effectively solves the above problems of heat dissipation and light blocking, silicon carbide is difficult to process and is even more costly than the sapphire, thereby restricting the application and promotion of the improved solution.

Further, another one of the existing improved solutions adopts a combination of a bonding technology and a peel-off technology, thus the epitaxial layer of the gallium nitride-based Light-Emitting Diode device is transferred to other substrate with high electrical conductivity and high thermal conductivity (which is for example made of an alloy material based on silicon (Si), copper (Cu) and aluminum (Al)). This improved solution eliminates the adverse effects of the sapphire substrate on the gallium nitride-base Light-Emitting Diode device. However, since a bonding substrate has a low light reflectivity, a reflective metallic layer must be deposited beyond an ITO extension layer of an LED chip in order to improve the light extraction efficiency. However, due to the use of the reflective metallic layer and the bonding technology, the another one of the existing improved solutions is defective in that: process difficulty and costs are increased, a chip of a structure with formal electrodes cannot be used for manufacturing the Light-Emitting Diode device, an electrode in the light emitting surface blocks light to be emitted so that the light extraction efficiency is reduced, and the wiring for the LED chip is difficult.

Therefore, there exists a need to provide a Light-Emitting Diode device (especially a high power Light-Emitting Diode device) with an improved light efficiency and an improved electrode structure and a manufacturing method thereof.

SUMMARY OF THE INVENTION

In order to solve the above problems existing in the solutions of the prior art, the present disclosure provides a Light-Emitting Diode device and a manufacturing method thereof.

The present disclosure includes the following technical solutions.

A Light-Emitting Diode device includes:

a substrate;

an epitaxial layer arranged at one side of the substrate, where the epitaxial layer includes an N-type layer, a P-type layer, and an active layer between the N-type layer and the P-type layer;

an N-type electrode, which is in ohmic contact with one side of the N-type layer that is away from the substrate;

a P-type electrode, which is in ohmic contact with one side of the P-type layer that is away from the substrate;

an adhesive layer, one side of which is electrically glued to both one side of the N-type electrode that is away from the N-type layer and one side of the P-type electrode that is away from the P-type layer; and a patterned substrate electrically glued to the other side of the adhesive layer;

where the Light-Emitting Diode device further includes an insulating layer between the N-type electrode and the P-type electrode, with the N-type electrode and the P-type electrode being electrically insulated by the insulating layer.

In the above disclosed solution, preferably, the substrate is a sapphire substrate.

In the above disclosed solution, preferably, the N-type layer is made of N-type gallium nitride.

In the above disclosed solution, preferably, the P-type layer is made of P-type gallium nitride.

In the above disclosed solution, preferably, the N-type electrode has a thickness in a range of 500 nm to 2 μm.

In the above disclosed solution, preferably, the P-type electrode has a thickness in a range of 500 nm to 2 μm.

In the above disclosed solution, preferably, the insulating layer has a thickness in a range of 50 nm to 500 nm.

In the above disclosed solution, preferably, the N-type electrode has a grid shape.

In the above disclosed solution, preferably, the P-type electrode is within each grid unit of the grid-shaped N-type electrode, and the P-type electrode and the N-type electrode are electrically insulated by the insulating layer.

In the above disclosed solution, preferably, the Light-Emitting Diode device further includes at least one bonding pad for an external lead wire, and the bonding pad is situated on the patterned substrate.

In the above disclosed solution, preferably, the patterned substrate is bonded to the P-type electrode and the N-type electrode through the adhesive layer.

The present disclosure also discloses the following technical solutions.

A method for manufacturing a Light-Emitting Diode device, including steps of:

(A1) forming an epitaxial layer on a substrate;

(A2) forming an N-type electrode, an insulating layer and a P-type electrode on one side of the epitaxial layer, where the N-type electrode and the P-type electrode are insulated electrically by the insulating layer; and (A3) bonding a patterned substrate to the N-type electrode and the P-type electrode through an adhesive layer formed on the patterned substrate.

In the above disclosed solution, preferably, the step (A1) further includes:

(B1) cleaning the substrate on which an epitaxial structure has been grown in standard solution; and (B2) etching the substrate on which the epitaxial structure has been grown by an ICP etching process to form the epitaxial layer, which includes an N-type layer, an active layer and a P-type layer.

In the above disclosed solution, preferably, the step (A2) further includes:

(C1) depositing the N-type electrode onto the N-type layer and forming an ohmic contact between the N-type electrode and the N-type layer;

(C2) depositing insulating material on the epitaxial layer to form the insulating layer;

(C3) etching a portion of the insulating layer on a surface of the P-type layer using a corrosive liquid to expose the P-type layer; and (C4) depositing the P-type electrode to the exposed P-type layer and forming an ohmic contact between the P-type electrode and the exposed P-type layer.

In the above disclosed solution, preferably, the step (A3) further includes:

(D1) patterning a surface metallic conductive layer on the substrate by using a corrosive liquid to form the adhesive layer;

(D2) applying a heterogenic conductive adhesive on the patterned substrate to form the adhesive layer; and (D3) bonding the patterned substrate to the N-type electrode and the P-type electrode by the adhesive layer through adopting a flip technology.

In the above disclosed solution, preferably, the substrate is a sapphire substrate.

In the above disclosed solution, preferably, the N-type layer is made of N-type gallium nitride.

In the above disclosed solution, preferably, the P-type layer is made of P-type gallium nitride.

In the above disclosed solution, preferably, the N-type electrode has a thickness in a range of 500 nm to 2 µm.

In the above disclosed solution, preferably, the P-type electrode has a thickness in a range of 500 nm to 2 µm.

In the above disclosed solution, preferably, the insulating layer has a thickness in a range of 50 nm to 500 nm.

In the above disclosed solution, preferably, the N-type electrode has a grid shape.

In the above disclosed solution, preferably, the P-type electrode is within each grid unit of the grid-shaped N-type electrode, and the P-type electrode and the N-type electrode are electrically insulated by the insulating layer.

In the above disclosed solution, preferably, the patterned substrate includes at least one bonding pad for an external lead wire, and the bonding pad is arranged on the patterned substrate.

In the above disclosed solution, preferably, the patterned substrate is bonded to the P-type electrode and the N-type electrode through the adhesive layer.

The Light-Emitting Diode device and the manufacturing method thereof disclosed by the present disclosure have the following advantages: (1) the use of the mirror-treated P-type electrode with high light reflectivity as the reflective layer improves the luminous efficiency of the Light-Emitting Diode device; (2) since the N-type electrode has the grid shape and the P-type electrode is within each grid unit of the grid-shaped N-type electrode, a wiring electrode of a big area can be omitted, thereby improving the light extraction efficiency; (3) since the bonding pad is located on the patterned substrate rather than on the LED chip, the wiring for the bonding pad is easier than the conventional wiring on the chip; (4) since the P-type electrode with a big area and high light reflectivity is used, an additional extension layer (e.g., an ITO layer, a ZnO layer, etc.) can be eliminated, thereby optimizing the manufacturing process; and (5) a distributed structure of the P-type electrode and the N-type electrode is advantageous for the extension of the current in the P-type gallium nitride, thereby improving an external quantum efficiency and increasing the light efficiency.

BRIEF DESCRIPTION OF THE DRAWINGS

Technical features and advantages of the present disclosure will be well understood by the skilled person in the art with reference to the accompanying drawings, among which.

DETAILED DESCRIPTION OF THE EMBODIMENTS

Figure 1:
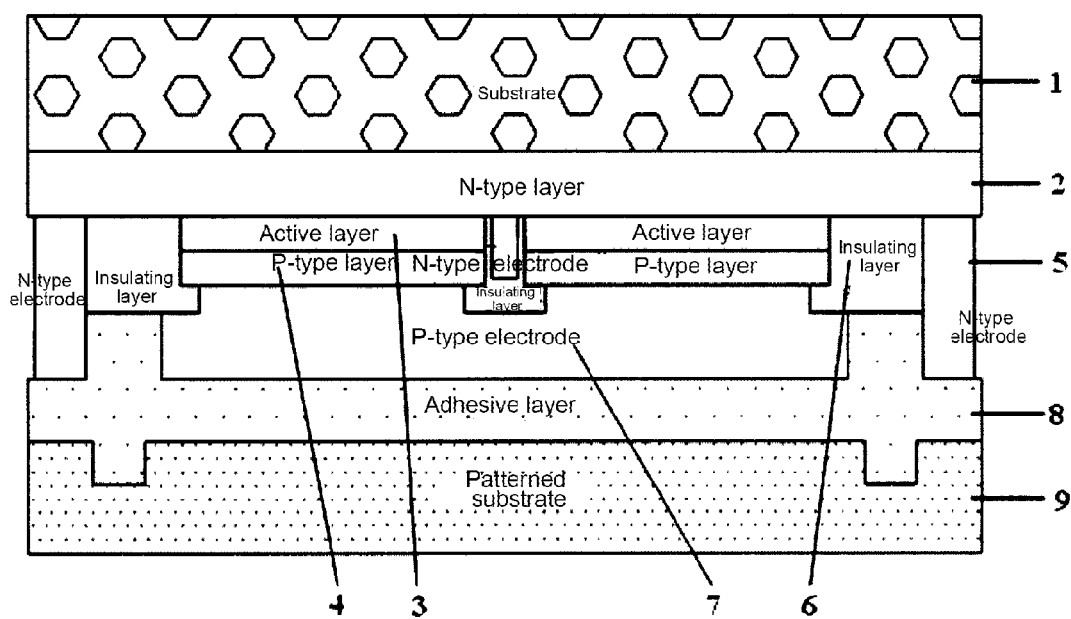
FIG. 1 is a schematic cross-sectional view of a Light-Emitting Diode device according to an embodiment of the present invention.

FIG. 1 is a schematic cross-sectional view of a Light-Emitting Diode device according to an embodiment of the present invention. As shown in FIG. 1, the Light-Emitting Diode device disclosed by the present disclosure includes: a substrate 1; an epitaxial layer located on one side of the substrate 1, where the epitaxial layer includes an N-type layer 2, a P-type layer 4, and an active layer 3 between the N-type layer and the P-type layer; an N-type electrode 5, which is in ohmic contact with one side of the N-type layer that is away from the substrate; a P-type electrode 7, which is in ohmic contact with one side of the P-type layer that is away from the substrate; an adhesive layer 8, one side of which is electrically adhered to both one side of the N-type electrode 5 that is away from the N-type layer 2 and one side of the P-type electrode 7 that is away from the P-type layer 4; and a patterned substrate 9 electrically adhered to the other side of the adhesive layer 8. The Light-Emitting Diode device further includes an insulating layer 6 between the N-type electrode 5 and the P-type electrode 7, with the N-type electrode 5 and the P-type electrode 7 being electrically insulated by the insulating layer 6.

Preferably, in the Light-Emitting Diode device disclosed by the present disclosure, the substrate 1 is a sapphire substrate (which has high light transmittance).

Preferably, in the Light-Emitting Diode device disclosed by the present disclosure, the N-type layer 2 is made of N-type gallium nitride.

Preferably, in the Light-Emitting Diode device disclosed by the present disclosure, the P-type layer 4 is made of P-type gallium nitride.

Preferably, in the Light-Emitting Diode device disclosed by the present disclosure, the active layer is a multiple quantum well active layer.

Preferably, in the Light-Emitting Diode device disclosed by the present disclosure, the N-type electrode 5 may be made of any one or more from a group including: a Ni/Ag alloy (i.e. a nickel/silver alloy), a Ni/Au alloy (i.e. a nickel/aurum alloy), a Ti/Au alloy (i.e. titanium/aurum alloy), a Ti/Al/Ti/Au alloy (i.e. titanium/aluminum/titanium/aurum alloy) and a Cr/Pt/Au alloy (i.e. chromium/platinum/aurum alloy). For example, the Ni/Ag alloy includes a nickel layer and a silver layer, and the like.

Preferably, in the Light-Emitting Diode device disclosed by the present disclosure, the P-type electrode 7 may be made of any one or more from a group including: a Ni/Ag alloy, a Ni/Au alloy, a Ti/Au alloy, a Ti/Al/Ti/Au alloy and a Cr/Pt/Au alloy. For example, the Ni/Ag alloy includes a nickel layer and a silver layer, and the like. In addition, the P-type electrode 7 has high light reflectivity.

Preferably, in the Light-Emitting Diode device disclosed by the present disclosure, the insulating layer is made of silicon dioxide ($SiO_2$), silicon nitride (SiN) or silicon oxynitride (SiON). In addition, the insulating layer has high light transmittance.

Preferably, in the Light-Emitting Diode device disclosed by the present disclosure, the adhesive layer 8 is a heterogenic conductive adhesive which has high thermal conductivity and high electrical conductivity.

Preferably, in the Light-Emitting Diode device disclosed by the present disclosure, the patterned substrate 9 has a surface metallic conductive layer and has high thermal conductivity and high electrical conductivity.

Preferably, in the Light-Emitting Diode device disclosed by the present disclosure, the N-type electrode 5 has a thickness in a range of 500 nm to 2 μm.

Preferably, in the Light-Emitting Diode device disclosed by the present disclosure, the P-type electrode 7 has a thickness in a range of 500 nm to 2 μm.

Preferably, in the Light-Emitting Diode device disclosed by the present disclosure, the insulating layer has a thickness in a range of 50 nm to 500 nm.

Figure 2:
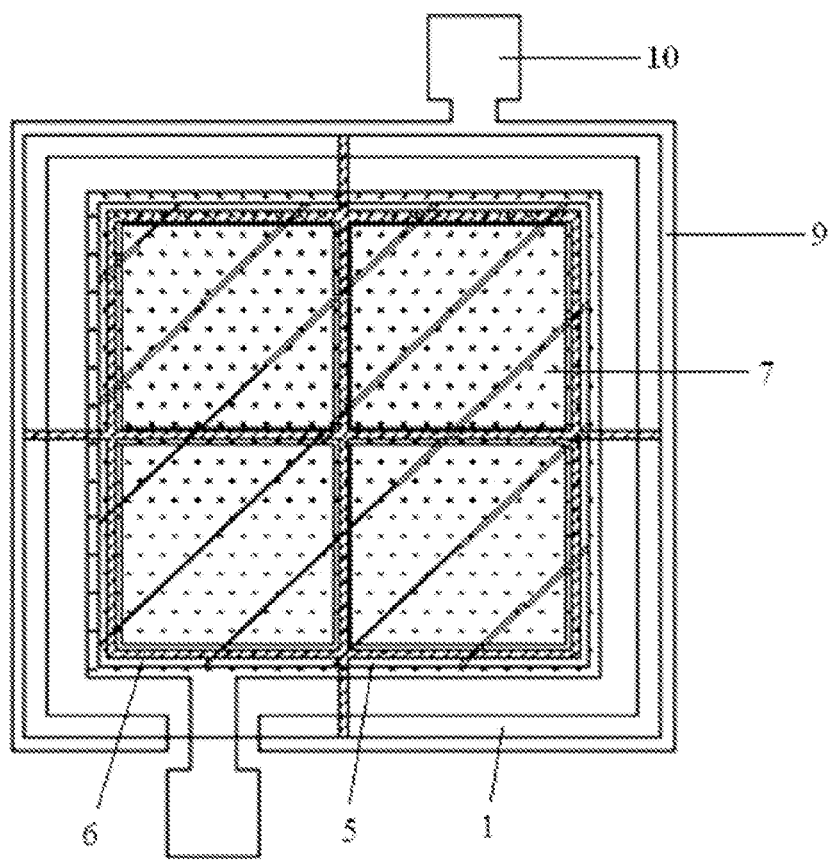
FIG. 2 is a schematic plan view of the Light-Emitting Diode device according to the embodiment of the present invention.

FIG. 2 is a schematic plan view of the Light-Emitting Diode device according to the embodiment of the present disclosure. As shown in FIGS. 1 and 2, preferably, in the Light-Emitting Diode device disclosed by the present disclosure, the N-type electrode 5 has a grid shape.

As shown in FIGS. 1-2, preferably, in the Light-Emitting Diode device disclosed by the present disclosure, the P-type electrode 7 is within each grid unit of the grid-shaped N-type electrode 5 (where the P-type electrode 7 and the N-type electrode 5 are electrically insulated by the insulating layer 6).

As shown in FIG. 2, preferably, the Light-Emitting Diode device disclosed by the present disclosure further includes at least one bonding pad 10 for an external lead wire (illustratively, in the embodiment shown in FIG. 2, the Light-Emitting Diode device includes two bonding pads), and the bonding pad 10 is arranged on the patterned substrate 9.

As shown in FIGS. 1-2, preferably, in the Light-Emitting Diode device disclosed by the present disclosure, the patterned substrate 9 is bonded to the P-type electrode 7 and the N-type electrode 5 through the adhesive layer 8.

As can be seen from the above, since the mirror-treated P-type electrode 7 with high light reflectivity is used as the reflective layer, the luminous efficiency of the Light-Emitting Diode device is improved. In addition, due to the adoption of such a structure in which the N-type electrode 5 is grid-shaped and the P-type electrode 7 is within each grid unit of the grid-shaped N-type electrode 5, a wiring electrode of a big area can be omitted, thereby improving the light extraction efficiency. Furthermore, the wiring is made through the bonding pad 10 arranged on the patterned substrate 9 after the patterned substrate 9 is bonded (that is, the bonding pad 10 is located on the patterned substrate 9 rather than on the LED chip), and hence is much easier than the conventional wiring on the chip.

Figure 3:
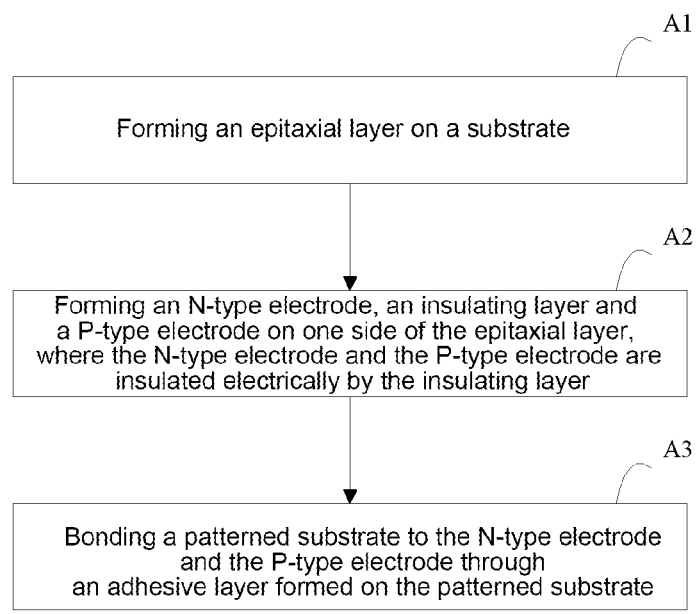
FIG. 3 is a flow chart of a method for manufacturing the Light-Emitting Diode device according to an embodiment of the present invention.

FIG. 3 is a flow chart of a method for manufacturing the Light-Emitting Diode device according to an embodiment of the present disclosure. As shown in FIG. 3, the method for manufacturing the Light-Emitting Diode device disclosed by the present disclosure includes the following steps of: (A1) forming an epitaxial layer on a substrate; (A2) forming an N-type electrode, an insulating layer and a P-type electrode on one side of the epitaxial layer, where the N-type electrode and the P-type electrode are insulated electrically by the insulating layer; and (A3) bonding a patterned substrate to the N-type electrode and the P-type electrode through an adhesive layer formed on the patterned substrate.

As shown in FIG. 3, in the method for manufacturing the Light-Emitting Diode device disclosed by the present disclosure, the step (A1) further includes: (B1) cleaning the substrate on which the epitaxial structure has been grown in a standard solution; and (B2) etching the substrate on which the epitaxial structure has been grown using an Inductively Coupled Plasma (ICP) etching process to form an epitaxial layer, which includes an N-type layer, an active layer and a P-type layer.

As shown in FIG. 3, in the method for manufacturing the Light-Emitting Diode device disclosed by the present disclosure, the step (A2) further includes: (C1) depositing the N-type electrode onto the N-type layer and forming an ohmic contact between the N-type electrode and the N-type layer; (C2) depositing insulating material on the epitaxial layer to form the insulating layer; (C3) etching a portion of the insulating layer on the surface of the P-type layer using a corrosive liquid to expose the P-type layer; and (C4) depositing the P-type electrode onto the exposed P-type layer and forming an ohmic contact between the P-type layer and the exposed P-type layer.

As shown in FIG. 3, in the method for manufacturing the Light-Emitting Diode device disclosed by the present disclosure, the step (A3) further includes: (D1) patterning a surface metallic conductive layer on the substrate to form the patterned substrate; (D2) applying a heterogenic conductive adhesive on the patterned substrate to form the adhesive layer; and (D3) bonding the patterned substrate to the N-type electrode and the P-type electrode by the adhesive layer through a flip technology.

Preferably, in the method for manufacturing the Light-Emitting Diode device disclosed by the present disclosure, the substrate is a sapphire substrate (which has high light transmittance).

Preferably, in the method for manufacturing the Light-Emitting Diode device disclosed by the present disclosure, the N-type layer is made of N-type gallium nitride.

Preferably, in the method for manufacturing the Light-Emitting Diode device disclosed by the present disclosure, the P-type layer is made of P-type gallium nitride.

Preferably, in the method for manufacturing the Light-Emitting Diode device disclosed by the present disclosure, the active layer is a multiple quantum well active layer.

Preferably, in the method for manufacturing the Light-Emitting Diode device disclosed by the present disclosure, the N-type electrode may be made of any one or more from a group including: a Ni/Ag alloy, a Ni/Au alloy, a Ti/Au alloy, a Ti/Al/Ti/Au alloy and a Cr/Pt/Au alloy. For example, the Ni/Ag alloy includes a nickel layer and a silver layer, and the like.

Preferably, in the method for manufacturing the Light-Emitting Diode device disclosed by the present disclosure, the P-type electrode may be made of any one or more from a group including: a Ni/Ag alloy, a Ni/Au alloy, a Ti/Au alloy, a Ti/Al/Ti/Au alloy and a Cr/Pt/Au alloy. For example, the Ni/Ag alloy includes a nickel layer and a silver layer, and the like. In addition, the P-type electrode 7 has high light reflectivity.

Preferably, in the method for manufacturing the Light-Emitting Diode device disclosed by the present disclosure, the insulating layer is made of $SiO_2$, SiN or SiON. In addition, the insulating layer has high light transmittance.

Preferably, in the method for manufacturing the Light-Emitting Diode device disclosed by the present disclosure, the adhesive layer has high thermal conductivity and high electrical conductivity.

Preferably, in the method for manufacturing the Light-Emitting Diode device disclosed by the present disclosure, the patterned substrate has high thermal conductivity and high electrical conductivity.

Preferably, in the method for manufacturing the Light-Emitting Diode device disclosed by the present disclosure, the N-type electrode has a thickness in a range of 500 nm to 2 μm.

Preferably, in the method for manufacturing the Light-Emitting Diode device disclosed by the present disclosure, the P-type electrode has a thickness in a range of 500 nm to 2 μm.

Preferably, in the method for manufacturing the Light-Emitting Diode device disclosed by the present disclosure, the insulating layer has a thickness in a range of 50 nm to 500 nm.

Preferably, in the method for manufacturing the Light-Emitting Diode device disclosed by the present disclosure, the N-type electrode has a grid shape.

Preferably, in the method for manufacturing the Light-Emitting Diode device disclosed by the present disclosure, the P-type electrode is within each grid unit of the grid-shaped N-type electrode (where the P-type electrode and the N-type electrode are electrically insulated by the insulating layer).

Preferably, in the method for manufacturing the Light-Emitting Diode device disclosed by the present disclosure, the patterned substrate includes at least one bonding pad 10 for an external lead wire (illustratively, two bonding pads), and the bonding pad 10 is arranged on the patterned substrate.

Preferably, in the method for manufacturing the Light-Emitting Diode device disclosed by the present disclosure, the patterned substrate is bonded to the P-type electrode and the N-type electrode through the adhesive layer.

As such, the P-type electrode having a big area and high light reflectivity is used, and therefore an additional extension layer (e.g., an ITO layer, a ZnO layer, etc.) is eliminated, thereby optimizing the manufacturing process.

Although the present invention has been described with reference to the preferred embodiments, the present invention is not limited to the above embodiments. It should be noted that various changes and modification can be made by the person skilled in the art without departing from the spirit and scope of the present invention.

The invention claimed is:

1. A method for manufacturing a Light-Emitting Diode device, comprising steps of:
   (A1) forming an epitaxial layer on a substrate;
   (A2) forming an N-type electrode, an insulating layer and a P-type electrode on one side of the epitaxial layer, wherein the N-type electrode and the P-type electrode are insulated electrically by the insulating layer; and
   (A3) bonding a patterned substrate to the N-type electrode and the P-type electrode through an adhesive layer formed on the patterned substrate, wherein the step (A3) further comprises:
   (D1) patterning a surface metallic conductive layer on the substrate by using a corrosive liquid to form the adhesive layer;
   (D2) applying a heterogenic conductive adhesive on the patterned substrate to form the adhesive layer; and
   (D3) bonding the patterned substrate to the N-type electrode and the P-type electrode by the adhesive layer through adopting a flip technology.

2. The method for manufacturing a Light-Emitting Diode device according to claim 1, wherein the step (A1) further comprises:
   (B1) cleaning the substrate on which an epitaxial structure has been grown in standard solution; and
   (B2) etching the substrate on which the epitaxial structure has been grown by an ICP etching process to form the epitaxial layer, which comprises an N-type layer, an active layer and a P-type layer.

3. The method for manufacturing a Light-Emitting Diode device according to claim 2, wherein the step (A2) further comprises:
   (C1) depositing the N-type electrode onto the N-type layer and forming an ohmic contact between the N-type electrode and the N-type layer;
   (C2) depositing insulating material on the epitaxial layer to form the insulating layer;
   (C3) etching a portion of the insulating layer on a surface of the P-type layer using a corrosive liquid to expose the P-type layer; and
   (C4) depositing the P-type electrode to the exposed P-type layer and forming an ohmic contact between the P-type electrode and the exposed P-type layer.

4. The method for manufacturing a Light-Emitting Diode device according to claim 1, wherein the substrate is a sapphire substrate.

5. The method for manufacturing a Light-Emitting Diode device according to claim 1, wherein the insulating layer has a thickness in a range of 50 nm to 500 nm.

6. The method for manufacturing a Light-Emitting Diode device according to claim 5, wherein the N-type electrode has a grid shape.

7. The method for manufacturing a Light-Emitting Diode device according to claim 6, wherein the P-type electrode is within each grid unit of the grid-shaped N-type electrode, and the P-type electrode and the N-type electrode are electrically insulated by the insulating layer.

8. The method for manufacturing a Light-Emitting Diode device according to claim 7, wherein the patterned substrate includes at least one bonding pad for an external lead wire, and the bonding pad is arranged on the patterned substrate.

* * * * *